(12) United States Patent
Hsu et al.

(10) Patent No.: US 11,374,105 B2
(45) Date of Patent: Jun. 28, 2022

(54) NANOSHEET DEVICE WITH DIPOLE DIELECTRIC LAYER AND METHODS OF FORMING THE SAME

(71) Applicant: Taiwan Semiconductor Manufacturing Co., Ltd., Hsin-Chu (TW)

(72) Inventors: Chung-Wei Hsu, Hsinchu County (TW); Kuo-Cheng Chiang, Hsinchu County (TW); Lung-Kun Chu, New Taipei (TW); Mao-Lin Huang, Hsinchu (TW); Jia-Ni Yu, New Taipei (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 74 days.

(21) Appl. No.: 16/835,759

(22) Filed: Mar. 31, 2020

(65) Prior Publication Data
US 2021/0305400 A1    Sep. 30, 2021

(51) Int. Cl.
| H01L 29/51 | (2006.01) |
| H01L 29/06 | (2006.01) |
| H01L 21/02 | (2006.01) |
| H01L 29/66 | (2006.01) |

(52) U.S. Cl.
CPC ...... *H01L 29/517* (2013.01); *H01L 21/02192* (2013.01); *H01L 29/0649* (2013.01); *H01L 29/0661* (2013.01); *H01L 29/513* (2013.01); *H01L 29/66818* (2013.01)

(58) Field of Classification Search
CPC ............... H01L 29/517; H01L 29/0649; H01L 29/0661; H01L 29/513; H01L 29/66818; H01L 21/02192
See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |

(Continued)

*Primary Examiner* — Christine A Enad
(74) *Attorney, Agent, or Firm* — Haynes and Boone, LLP

(57) ABSTRACT

Semiconductor device and the manufacturing method thereof are disclosed. An exemplary semiconductor device comprises first semiconductor layers and second semiconductor layers over a substrate, wherein the first semiconductor layers and the second semiconductor layers are separated and stacked up, and a thickness of each second semiconductor layer is less than a thickness of each first semiconductor layer; a first interfacial layer around each first semiconductor layer; a second interfacial layer around each second semiconductor layer; a first dipole gate dielectric layer around each first semiconductor layer and over the first interfacial layer; a second dipole gate dielectric layer around each second semiconductor layer and over the second interfacial layer; a first gate electrode around each first semiconductor layer and over the first dipole gate dielectric layer; and a second gate electrode around each second semiconductor layer and over the second dipole gate dielectric layer.

20 Claims, 14 Drawing Sheets

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 10,763,177 B1* | 9/2020 | Zhang | H01L 21/823462 |
| 2017/0140933 A1* | 5/2017 | Lee | H01L 29/0649 |
| 2020/0373300 A1* | 11/2020 | Zhang | H01L 29/66439 |
| 2021/0184001 A1* | 6/2021 | Trivedi | H01L 29/785 |

* cited by examiner

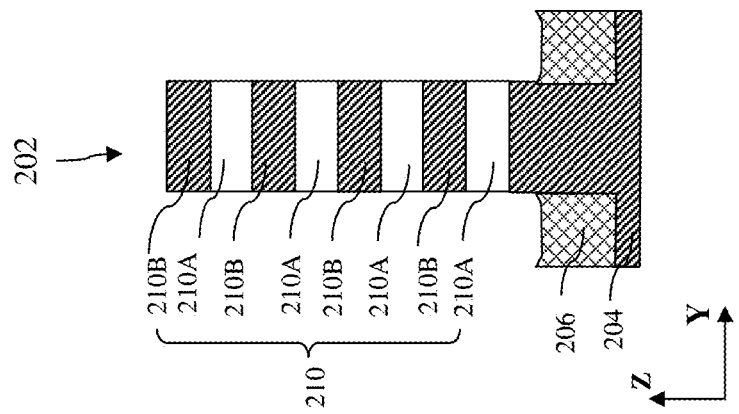
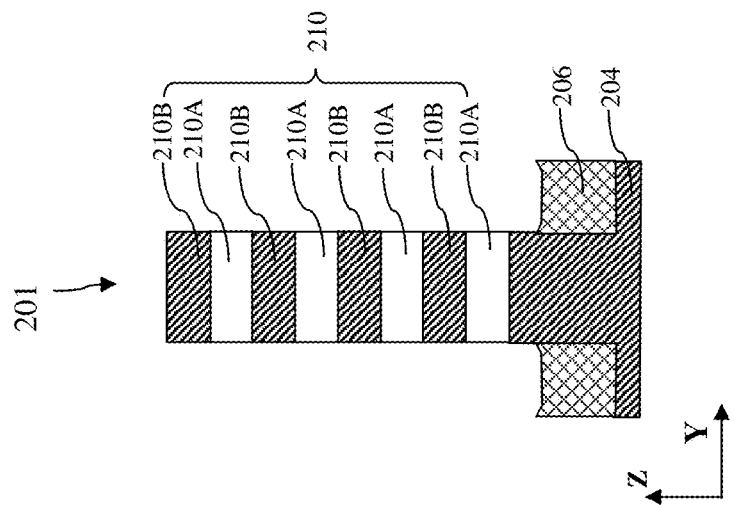

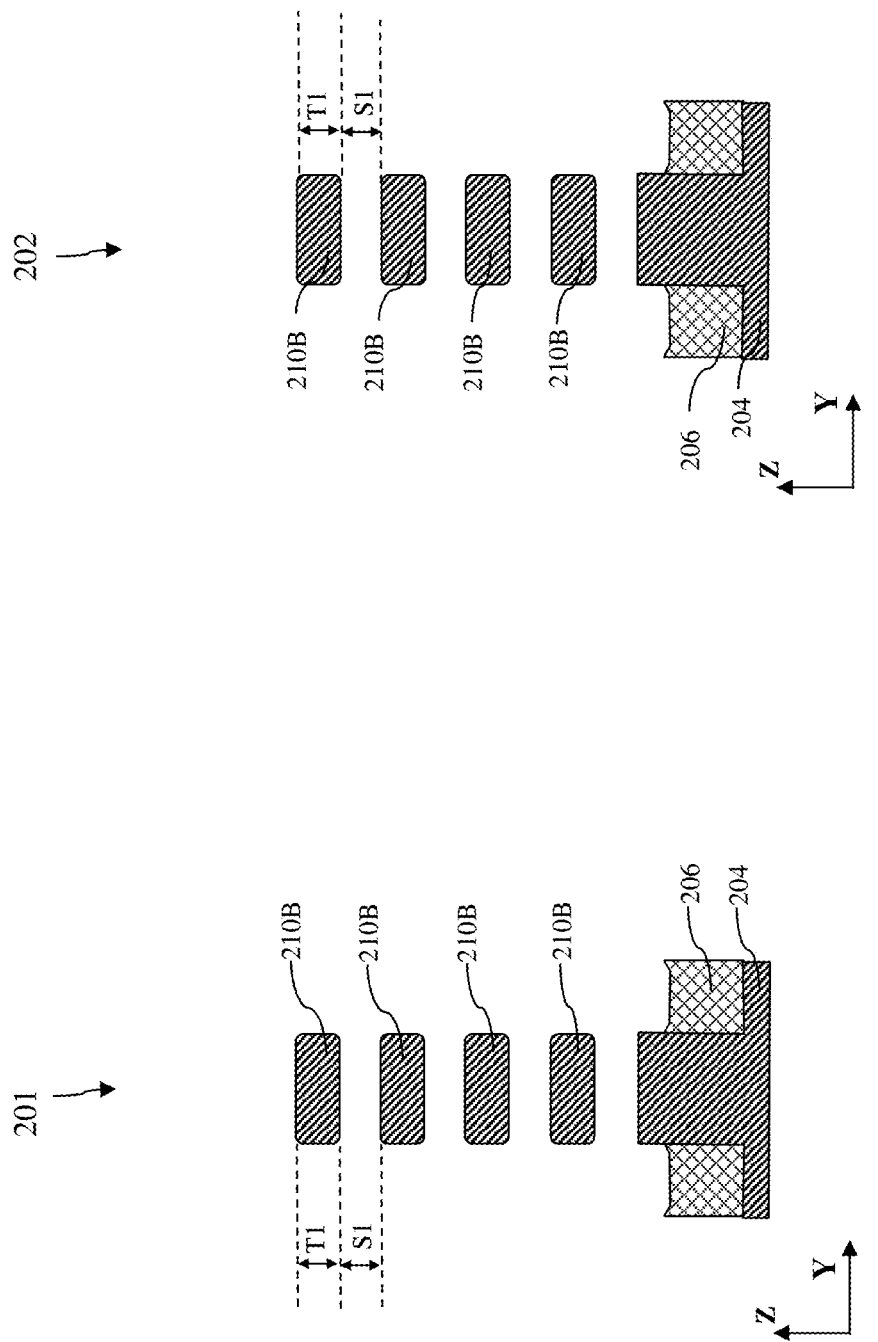

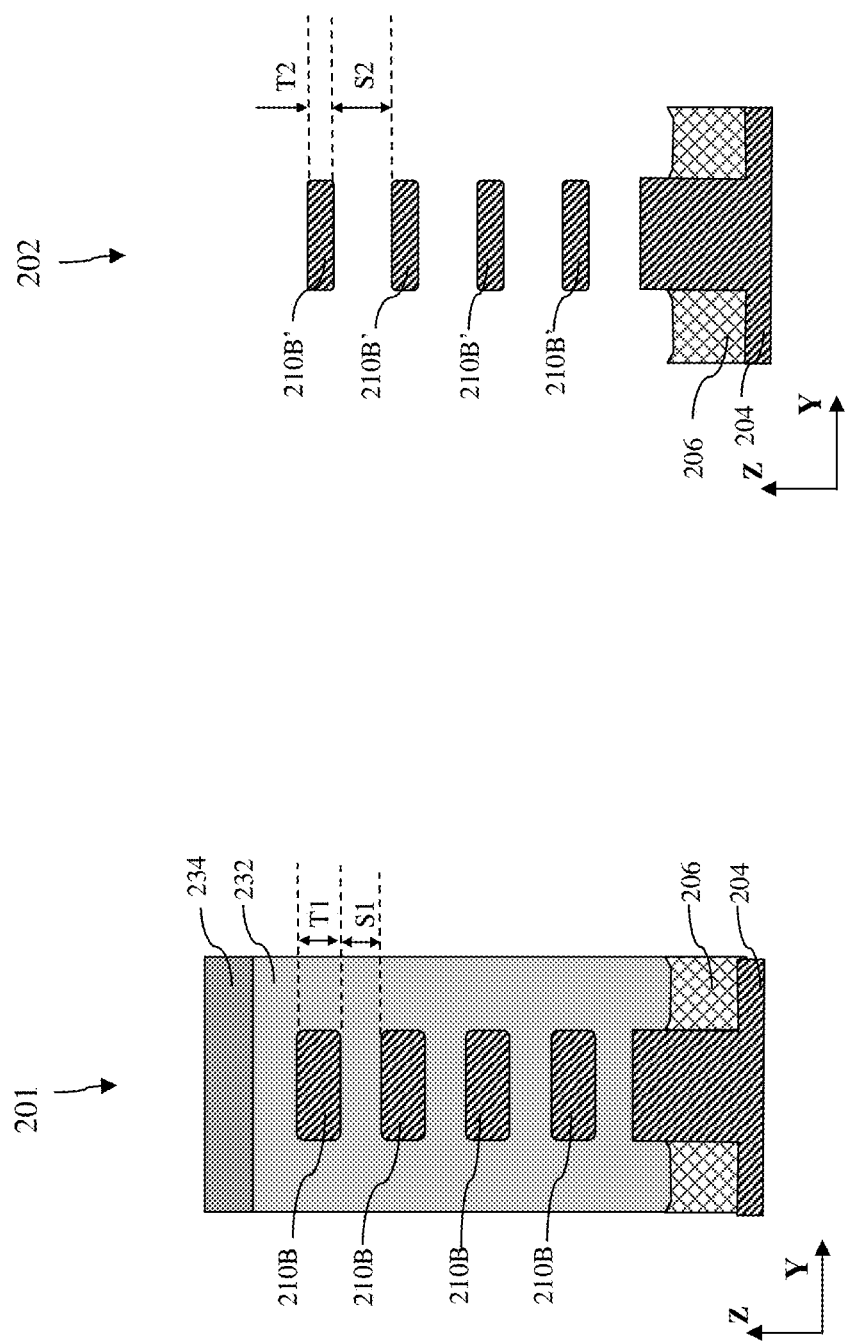

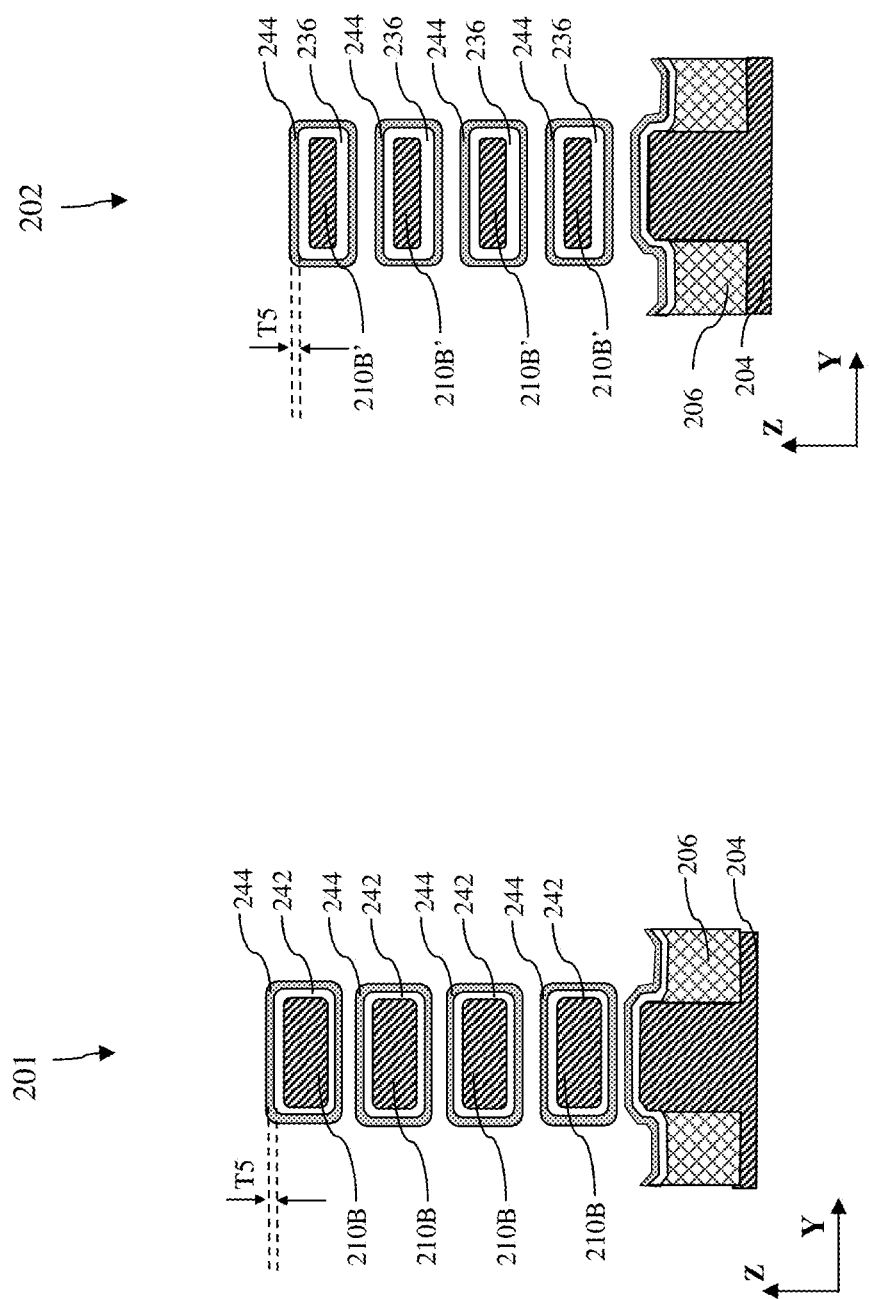

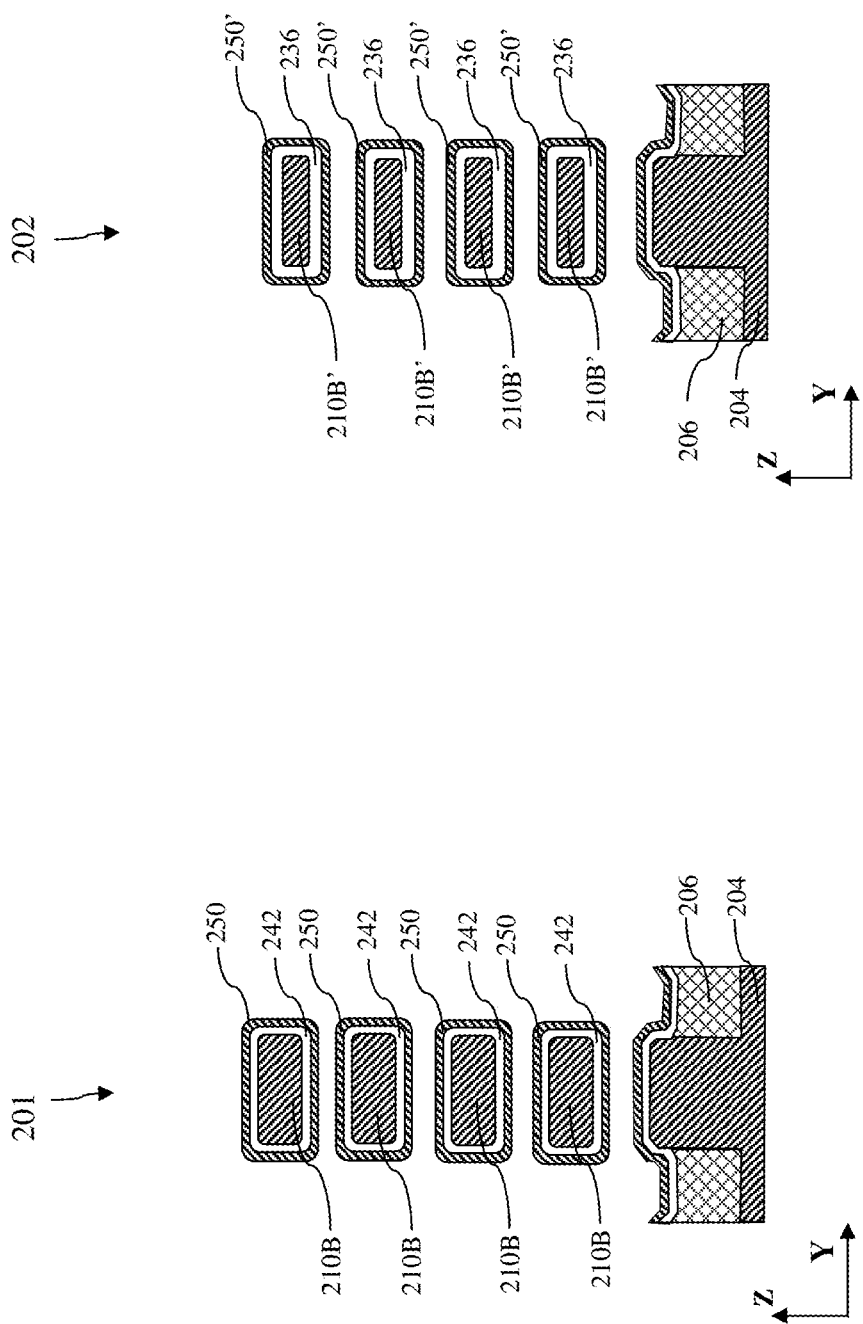

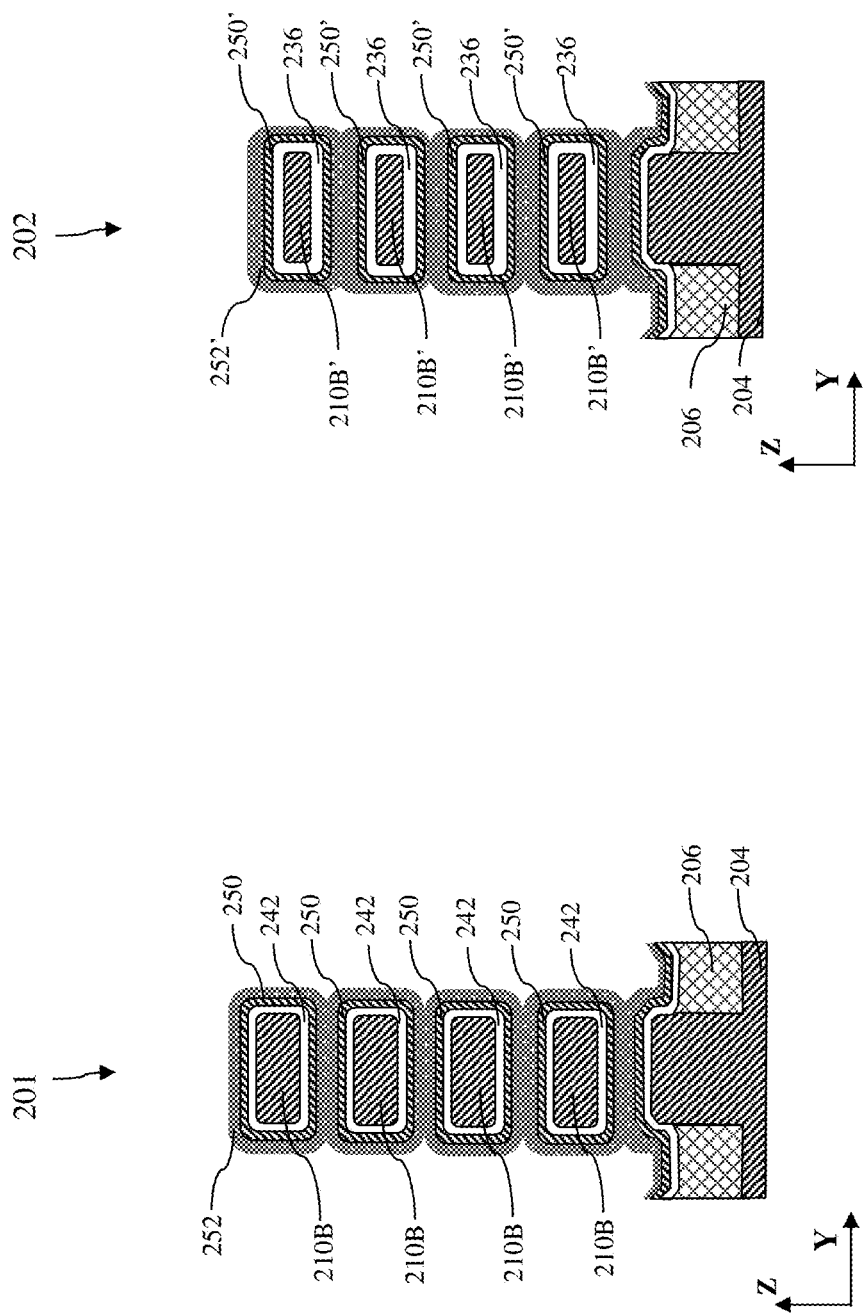

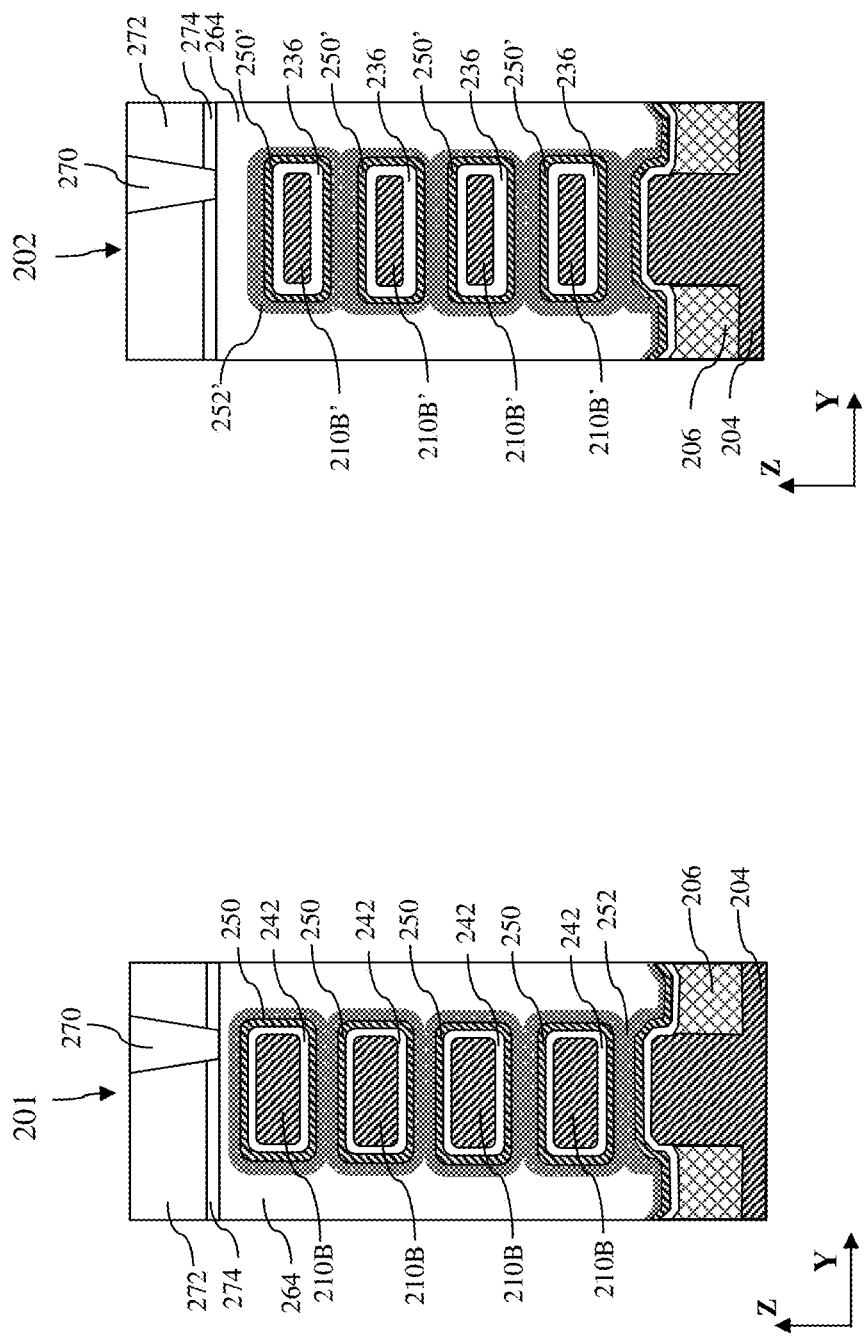

NANOSHEET DEVICE WITH DIPOLE DIELECTRIC LAYER AND METHODS OF FORMING THE SAME

BACKGROUND

Multi-gate devices have been introduced to improve gate control by increasing gate-channel coupling and reducing off-state current. One such multi-gate device is a device. A nanosheet device generally refers to any device having a channel region including separated channel semiconductor layers, and a gate structure, or portions thereof, formed on more than one side of the channel region (for example, surrounding a portion of the channel region). In some instances, a nanosheet device is also called as a nanowire device, a nanoring device, a gate-surrounding device, a gate-all-around (GAA) device, or a multi-channel bridge device. Nanosheet transistors are compatible with conventional complementary metal-oxide-semiconductor (CMOS) fabrication processes and allow aggressive scaling down of transistors.

However, fabrication of nanosheet devices presents challenges. For example, usually the threshold voltage (Vt) of a semiconductor device is achieved by adjusting the work function metal (WFM) in a gate electrode. Due to the thicker gate interfacial layer in the input/output (I/O) area than in the core area, the space between the channel semiconductor layers in the I/O area is very limited. Thus, the high-k dielectric layers may be merged between the channel semiconductor layers in the I/O area, and there is no room for the WFM to be formed between the channel semiconductor layers. Thereby, the desired Vt of the semiconductor device in the I/O area cannot be achieved by applying the WFM, and the nanosheet device's performance is degraded. Improvements are thus needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 5A, 6A, 7A, 8A, 9A, 10A, 11A, 12A, 13A, and 14A illustrate cross-sectional views of the semiconductor device in the core area of the example IC at intermediate stages of the method of FIG. 1 in accordance with some embodiments of the present disclosure.

FIGS. 4B, 5B, 6B, 7B, 8B, 9B, 10B, 11B, 12B, 13B, and 14B illustrate cross-sectional views of the semiconductor device in the I/O area of the example IC at intermediate stages of the method of FIG. 1 in accordance with some embodiments of the present disclosure.

DETAILED DESCRIPTION

Figure 1:
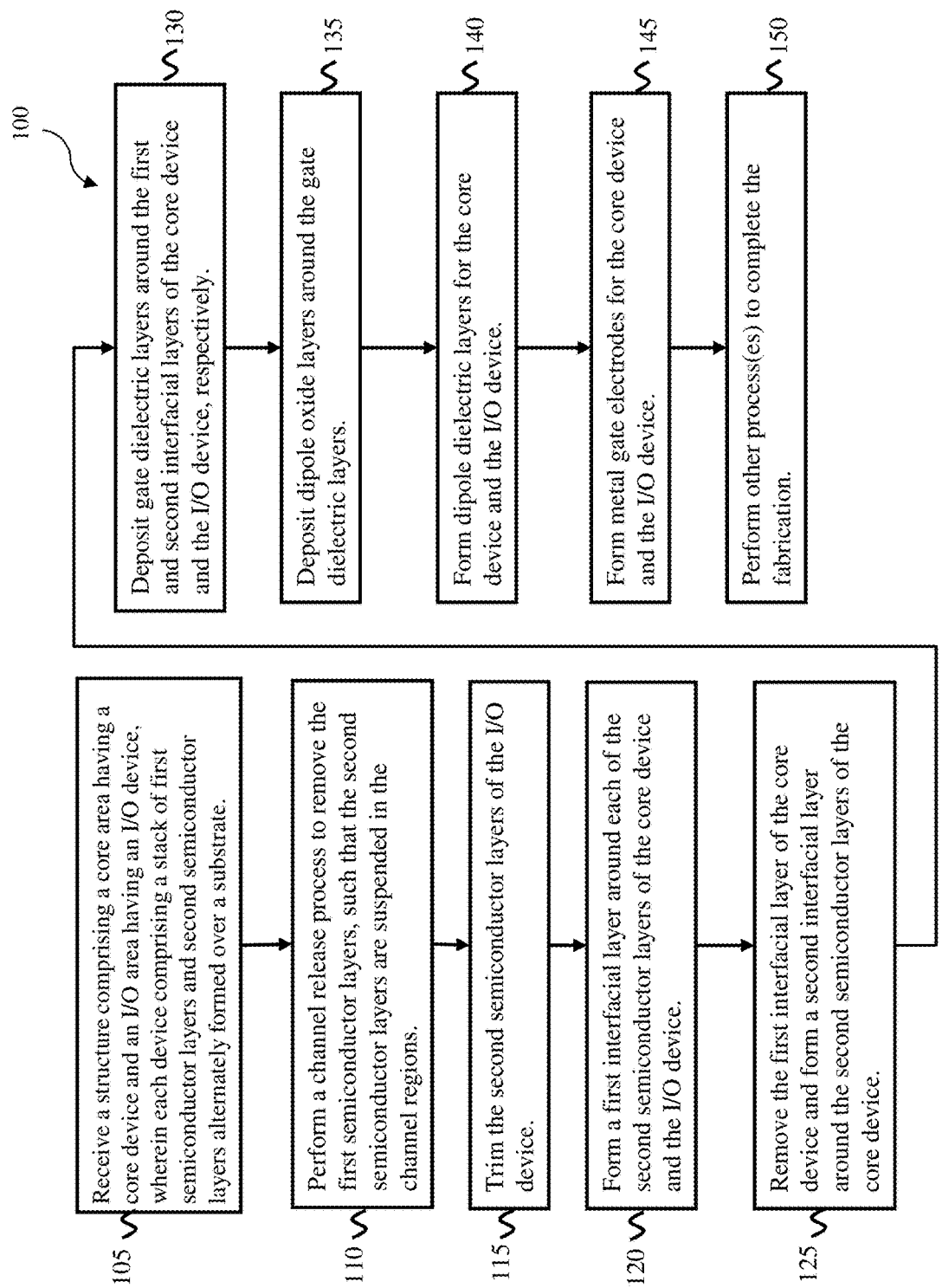
FIG. 1 illustrates a flowchart of an example method for making an example integrate circuit (IC) in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as nanosheet FETs (nanosheet FETs).

In a nanosheet device, a channel region of a single device may comprise multiple layers of semiconductor material physically separated from one another. In some examples, a gate of the device is disposed above, alongside, and even between the semiconductor layers of the device. However, in a conventional nanosheet device, especially in a nanosheet device in the I/O area of an IC, due to the thick gate interfacial layer, the space between the channel semiconductor layers are very limited. Thus, the high-k dielectric layers may be merged therebetween and there is no room for the gate electrode, including work function metal (WFM) and bulk metal, to be inserted between the channel semiconductor layers. In addition, dipole process cannot be applied to the merged portion of the high-k dielectric layer. Therefore, the desired threshold voltage of the semiconductor device in the I/O area are difficult to achieve by adjusting the WFM, neither by the dipole process. The semiconductor device in the I/O area may have a higher threshold voltage than desired, and the performance is degraded.

The present disclosure is generally related to formation of nanosheet devices, wherein the channel semiconductor layers of the semiconductor device in the I/O area are trimmed, such that the channel semiconductor layers in the I/O area are thinner than those in the core area, therefore the space between the channel semiconductor layers in the I/O area is enlarged. Thereby, the merging issue of the high-k dielectric layers between the channel semiconductor layers in the I/O area is mitigated, work function metal layer(s) may be formed between the channel semiconductor layers for both the core area the I/O area. Further, the high-k dielectric layers in both areas may be dipoled to provide more rooms for the metal gate structures (including WFMs and bulk metals). Of course, these advantages are merely examples, and do not limit the disclosed embodiments.

Figure 2:
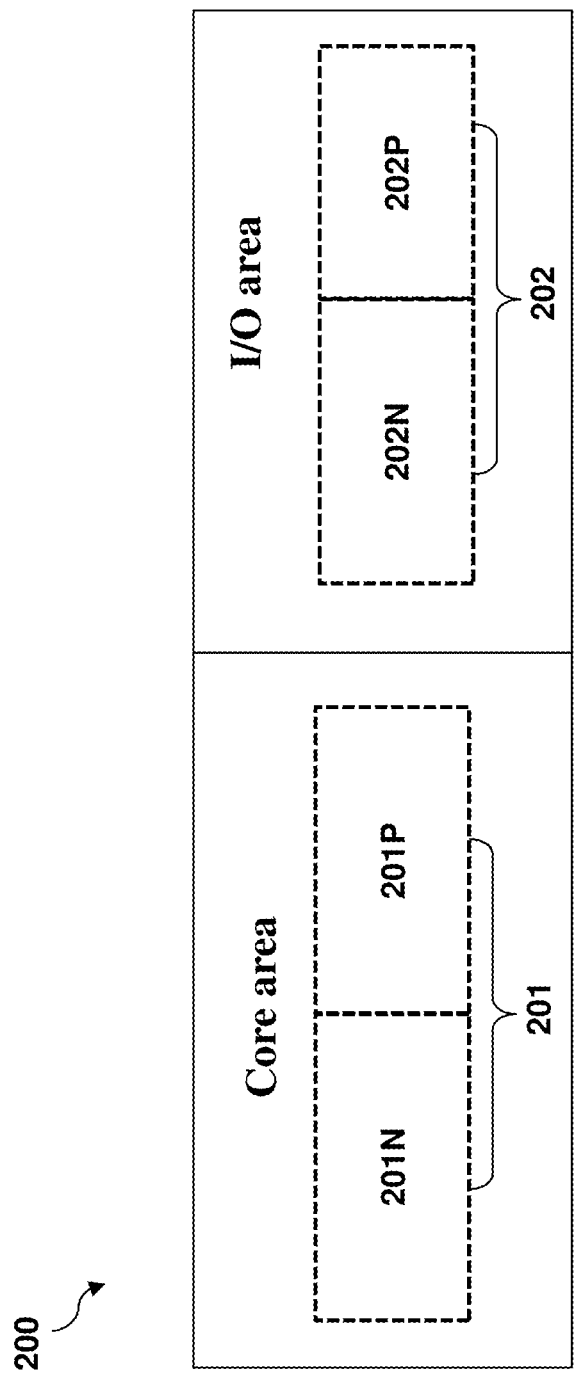
FIG. 2 illustrates a schematic diagram of the example IC comprising semiconductor devices in a core area and an I/O area in accordance with some embodiments of the present disclosure.
Figure 3:
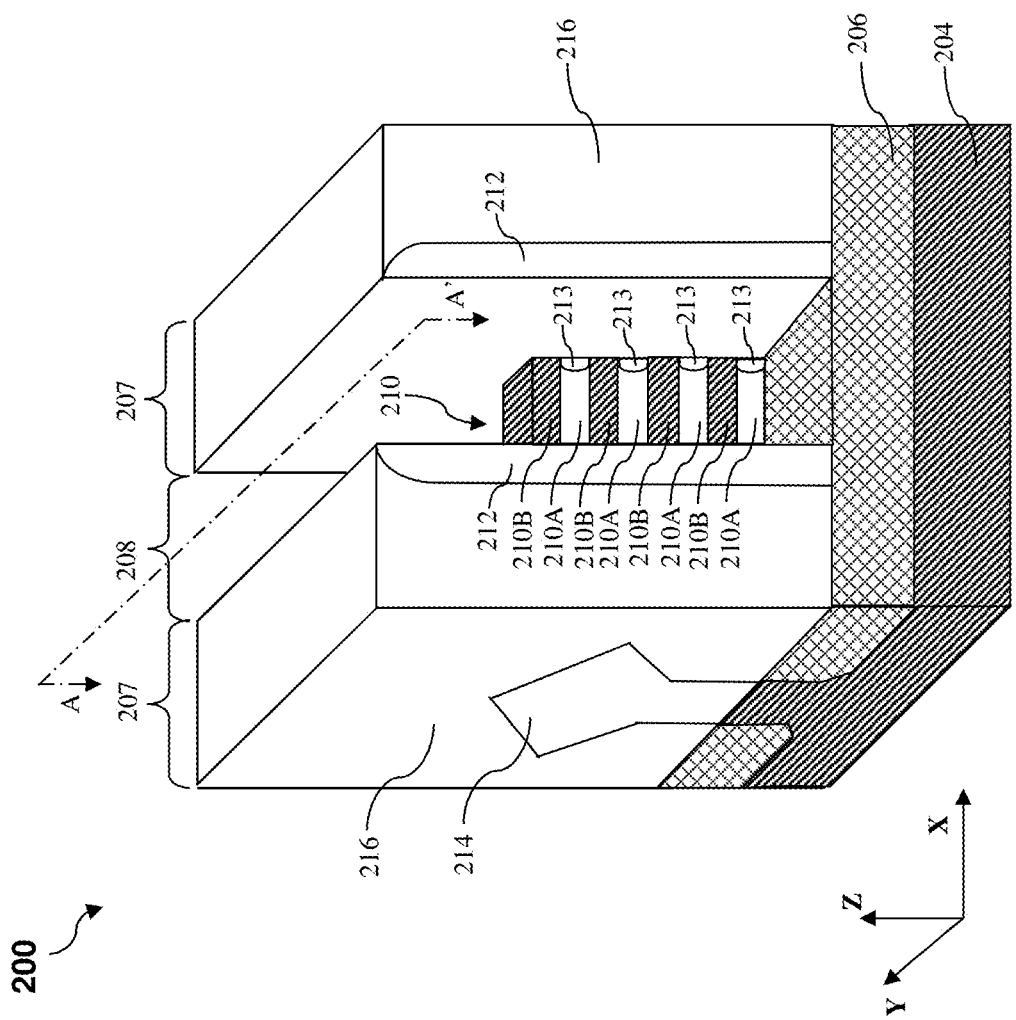
FIG. 3 illustrates a three-dimensional perspective view of one example semiconductor device at intermediate stages of the method of FIG. 1 in accordance with some embodiments of the present disclosure.

FIG. 1 illustrates a flow chart of a method 100 for making an example integrated circuit 200 (hereinafter, IC 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate a schematic diagram of IC 200, and various three-dimensional and cross-sectional views of the device(s) in IC 200 during intermediate steps of method 100. In particular, FIG. 2 illustrates a simplified schematic diagram of the IC 200 comprising different types (n-type and p-type) of semiconductor devices in a core area and in an I/O area in accordance with some embodiments of the present disclosure. FIG. 3 illustrates a three-dimensional view of one of the semiconductor devices of IC 200 at an initial stage of the method 100. FIGS. 4A-14A illustrate cross-sectional views of the semiconductor devices in the core area of the IC 200 taken along the plane A-A' shown in FIG. 3 (that is, in a Y-Z plane). And, FIGS. 4B-14B illustrate cross-sectional views of the semiconductor devices in the I/O area of the IC 200 taken along the plane A-A' shown in FIG. 3 (that is, in the Y-Z plane).

In some implementations, IC 200 is a portion of an IC chip, a system on chip (SoC), or portion thereof, that comprises various passive and active microelectronic devices, such as resistors, capacitors, inductors, diodes, p-type field effect transistors (PFETs), n-type field effect transistors (NFETs), fin-like FETs (FinFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2, 3, 4A-14A and 4B-14B are simplified for the sake of clarity to better understand the inventive concepts of the present disclosure. The present disclosure is not limited to any particular number of devices or device regions, or to any particular device configurations.

Referring to FIGS. 1, 2, 3, 4A and 4B, at operation 105 (FIG. 1), an initial semiconductor structure of IC 200 is received. It is referred to as the semiconductor structure 200 (so, IC 200 and semiconductor structure 200 are used interchangeably in this disclosure). As depicted in FIG. 2, IC 200 comprises a core area (which may comprise logic devices or memory devices) and an I/O area (which may comprise input, output, or input/output devices). In some embodiments, IC 200 may comprise other areas. In the present embodiment, the core area and the I/O area are areas of an IC formed on a single semiconductor substrate (for example, substrate 204 in FIGS. 3, 4A-14A, and 4B-14B). The core area comprises different devices, such as n-type semiconductor device(s) 201N and p-type semiconductor device(s) 201P (both refer to as core devices 201). Similarly, the I/O area comprises different devices, such as n-type semiconductor device(s) 202N and p-type semiconductor device(s) 202P (both refer to as I/O devices 202).

FIG. 3 is a three-dimensional view of an initial semiconductor structure of one semiconductor device (for example, core device 201 or I/O device 202) received at operation 105. FIGS. 4A and 4B are cross-section views along plane A-A' in FIG. 3 for the core device 201 and the I/O device 202, respectively.

Referring to FIGS. 3, 4A and 4B, IC 200 comprises a substrate 204. In the depicted embodiment, the substrate 204 is a bulk silicon substrate. Alternatively or additionally, the substrate 204 includes another single crystalline semiconductor, such as germanium; a compound semiconductor; an alloy semiconductor; or combinations thereof. Alternatively, the substrate 204 is a semiconductor-on-insulator substrate, such as a silicon-on-insulator (SOI) substrate, a silicon germanium-on-insulator (SGOI) substrate, or a germanium-on-insulator (GOI) substrate. The substrate 204 may be doped with different dopants to form various doped regions therein. For example, the substrate 204 may include PFET region comprising n-type doped substrate regions (such as n-well) and NFET region comprising p-type doped substrate regions (such as p-well).

The semiconductor structure 200 also comprises a semiconductor layer stack 210 (hereinafter, stack 210) formed over the substrate 204. In the depicted embodiment, the stack 210 comprises alternating semiconductor layers, such as semiconductor layers 210A including a first semiconductor material and semiconductor layers 210B including a second semiconductor material that is different from the first semiconductor material. The different semiconductor materials in the semiconductor layers 210A and 210B have different oxidation rates and/or different etch selectivity. In some embodiments, the second semiconductor material of the semiconductor layers 210B is the same as the substrate 204. For example, the semiconductor layers 210A comprise silicon germanium (SiGe), and the semiconductor layers 210B comprise Si (like the substrate 204). Thus, the stack 210 is arranged with alternating SiGe/Si/SiGe/Si/ . . . layers from bottom to top. In some embodiments, the material of the top semiconductor layer may or may not be the same as the bottom semiconductor layer in the stack. For example, for a stack that comprises alternating SiGe and Si layers, the bottom semiconductor layer comprises SiGe, and the top semiconductor layer may comprise Si or SiGe. In the depicted embodiment, the bottom semiconductor layer 210A comprises SiGe, while the top semiconductor layer 210B comprises Si. In some embodiments, the semiconductor layers 210B may be undoped or substantially dopant-free. In other words, no intentional doping is performed when forming the semiconductor layers 210B. In some other embodiments, the semiconductor layers 210B may be doped with a p-type dopant or an n-type dopant. The number of the semiconductor layers 210A and 210B in the stack 210 depends on the design of IC 200. For example, the stack 210 may comprise one to ten layers of semiconductor layers 210A or 210B each. In some embodiments, different semiconductor layers 210A and 210B in the stack 210 have the same thickness in the Z-direction. In some other embodiments, different semiconductor layers 210A and 210B in the stack 210 have different thicknesses.

The stack 210 is formed over the substrate 204 using any suitable process. In some embodiments, the semiconductor layers 210A and/or 210B are formed by suitable epitaxy process. For example, semiconductor layers comprising SiGe and Si are formed alternately over the substrate 204 by a molecular beam epitaxy (MBE) process, a chemical vapor deposition (CVD) process, such as a metal organic CVD (MOCVD) process, and/or other suitable epitaxial growth processes. Thereafter, a photoresist and an etching process may be performed to the semiconductor layers to form the stack 210 (comprising semiconductor layers 210A and 210B) in a fin-shape as illustrated in FIGS. 4A and 4B. The fin-shape stack 210 extends along the X-direction and comprises a channel region 208, a source region, and a drain region (hereinafter both referred to as S/D regions 207) (FIG. 3). The S/D regions 207 are interposed by the channel region 208. As illustrated in FIG. 3, the plane A-A' is taken in the channel region 208 of the stack 210.

The semiconductor structure 200 also comprises an isolation feature 206 formed over the substrate 204 to separate and isolate the active regions. In some embodiments, one or more dielectric materials, such as silicon dioxide ($SiO_2$) and/or silicon nitride ($Si_3N_4$), is deposited over the substrate 204 along sidewalls of the stack 210. The dielectric material may be deposited by CVD (such as plasma enhanced CVD (PECVD)), physical vapor deposition (PVD), thermal oxidation, or other techniques. Subsequently, the dielectric material is recessed (for example, by etching) to form the isolation feature 206. In some embodiments, a top surface of the isolation feature 206 is substantially coplanar with or lower than a bottom surface of the lowermost first semiconductor layer 210A, as depicted in FIGS. 3, 4A and 4B.

The semiconductor structure 200 also comprises gate spacers 212 formed over the stack 210. In some embodiments, the gate spacers 212 comprise a dielectric material, such as silicon dioxide ($SiO_2$), silicon nitride ($Si_3N_4$), silicon oxynitride (SiON), or silicon carbide (SiC). The gate spacers 212 are formed by any suitable process(es). For example, first, a dummy gate stack (comprising polysilicon, not shown) is formed over the channel region 208 of the stack 210. A spacer layer comprising the dielectric material is then deposited (for example, by atomic layer deposition (ALD), CVD, PVD, or other proper process) over the substrate 204 and the dummy gate stack. Subsequently, the spacer layer is anisotropically etched to remove the portions in the X-Y plane (the plane in which the top surface of the substrate 204 is). The remaining portions of the spacer layer become the gate spacers 212.

Thereafter, S/D regions 207 of the stack 210 may be recessed along sidewalls of the gate spacers 212, and inner spacers 213 are formed between the edges of the semiconductor layers 210B. In some embodiments, the S/D regions 207 of the stack 210 are recessed by a S/D etching process performed along the gate spacers 212 to form S/D trenches. The S/D etching process may be a dry etch, a wet etch, or combinations thereof. The duration of the S/D etching process is controlled such that the sidewalls of each semiconductor layers 210A and 210B are exposed in the S/D trenches. Thereafter, portions (edges) of the semiconductor layers 210A exposed in the S/D trenches are selectively removed by a suitable etching process to form gaps between adjacent semiconductor layers 210B. In other words, edges of the semiconductor layers 210B are suspended in the S/D regions 207. Subsequently, inner spacers 213 are formed to fill in the gaps between the adjacent semiconductor layers 210B. The inner spacers 213 comprise a dielectric material that is similar to the material of the gate spacers, such as $SiO_2$, $Si_3N_4$, SiON, SiC, or combinations thereof. The dielectric material of the inner spacers may be deposited in the S/D trenches and in the gaps between the edges of the semiconductor layers 210B by CVD, PVD, ALD, or combinations thereof. Extra dielectric material is removed along sidewalls of the gate spacers 212 until the sidewalls of the semiconductor layers 210B are exposed in the S/D trenches.

Thereafter, epitaxial S/D features 214 are formed in the S/D regions 207 of the stack 210. In some embodiments, the epitaxial S/D features 214 may comprise a semiconductor material such as silicon (Si) or germanium (Ge); a compound semiconductor such as silicon germanium (SiGe), silicon carbide (SiC), gallium arsenide (GaAs), etc.; an alloy semiconductor; or combinations thereof. An epitaxy process may be implemented to epitaxially grow S/D features 214. The epitaxy process may comprise CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. Epitaxial S/D features 214 may be doped with n-type dopants and/or p-type dopants. In some embodiments, epitaxial S/D features 214 may comprise multiple epitaxial semiconductor layers, and different epitaxial semiconductor layers are different in amount of dopant comprised therein.

The semiconductor structure also comprises an interlayer dielectric (ILD) layer 216 formed over the substrate 204. As illustrated in FIG. 3, the ILD 216 is disposed along the gate spacers 212 and covers the isolation feature 206 and the epitaxial S/D features 214. In some embodiments, the ILD layer 216 comprises a low-k dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 216 may comprise a multi-layer structure having multiple dielectric materials and may be formed by a deposition process such as CVD, flowable CVD (FCVD), spin-on-glass (SOG), other suitable methods, or combinations thereof. In some embodiments, an etch stop layer (ESL, not shown) including dielectric material(s) (such as $SiO_2$, SiON, $Si_3N_4$, SiCN, SiOC, SiOCN) may be deposited between the ILD layer 216 and the isolation feature 206 and between the ILD layer 216 and the epitaxial S/D features 214.

After the formation of the ILD layer 216, the dummy gate stack may be removed to form a gate trench that exposes the channel region 208 of the stack 210. In some embodiments, removing the dummy gate stack comprises one or more etching processes, such as wet etching, dry etching, reactive-ion etching (RIE), or other etching techniques.

Now referring to FIGS. 1, 5A, and 5B, at operation 110, a channel release process is performed, such that the semiconductor layers 210A are removed from the gate trench. As a result, the semiconductor layers 210B are suspended in the channel region. The suspended semiconductor layers 210B (also referred to as channel semiconductor layers) are collectively referred to as a stack structure. The semiconductor layers 210A are removed by a selective etching process that is tuned to remove only the semiconductor layers 210A while the semiconductor layers 210B remain substantially unchanged. The selective etching may be a selective wet etching, a selective dry etching, or a combination thereof. In some embodiments, the selective wet etching process may comprise a hydro fluoride (HF) or $NH_4OH$ etchant. In some embodiments, the selective removal of semiconductor layers 210A may comprise an oxidation process followed by oxidation removal. For example, the SiGe oxidation process may comprise forming and patterning various masking layers such that the oxidation is controlled to the SiGe layers 210A. In other embodiments, the SiGe oxidation process is a selective oxidation due to the different compositions of the semiconductor layers 210A and 210B. In some examples, the SiGe oxidation process may be performed by exposing the IC 200 to a wet oxidation process, a dry oxidation process, or a combination thereof. Thereafter, the oxidized semiconductor layers 210A, which comprise silicon germanium oxides (SiGeO), are removed by an etchant such as $NH_4OH$ or diluted HF.

As depicted in FIGS. 5A and 5B, each of the stack structures comprises the channel semiconductor layers 210B separated from each other and stacked up along a direction (Z-direction) generally perpendicular to a top surface of the substrate 204 (X-Y plane). In some embodiments, the semiconductor layers 210B are slightly etched or not etched during the operation 110. Further, semiconductor layers 210B may be of any suitable shapes, such as a wire-like shape, a sheet-like shape, or other geometrical shape (for other stack structure transistors). In the depicted embodiment, each of the semiconductor layers 210B has a thickness T1 in the Z-direction, and the adjacent suspended semiconductor layers 210B are separated with a space S1 in the Z-direction. In some embodiments, the thickness T1 is about 3 nanometers (nm) to about 20 nm. In some embodiments, the space S1 is about 5 nm to about 15 nm.

Now referring to FIGS. 1, 6A and 6B, at operation 115, the semiconductor layers 210B in the I/O device 202 are further trimmed from the thickness T1 to a thinner thickness T2. This extra trimming is different from the slightly etching, if any, in the operation 110. The purpose of this trimming is to reduce the thickness of the channel semiconductor layers 210B in the I/O device 202 and enlarge the space therebetween. Referring to FIG. 6A, before the trimming, a hard mask 232 (for example, a bottom anti-reflective coating (BARC) layer) is formed to cover the core device 201. The hard mask 232 may be formed by various steps. For example, first, a hard mask 232 is formed over the substrate 204 by a deposition process including CVD, PVD, ALD, spin on, other suitable methods, or combinations thereof. Thereafter, a photoresist layer 234 is formed over the hard mask 232. The photoresist layer 234 is patterned such that a portion of the hard mask 232 over the I/O device 202 is exposed from the photoresist layer 234. Subsequently, the exposed portion of the hard mask 232 is removed by a suitable etching process, such as a dry etch, a wet etch, or combinations thereof. The remaining portion of the hard mask 232 and the photoresist layer 234 are used as protective mask when trimming the semiconductor layers 210B of the I/O device 202.

Thereafter, an etching process is performed to the semiconductor layers 210B of the I/O device 202. The etching process may comprise a dry etching, a wet etching, other etching process, or combinations thereof. In some embodiments, the etching process is an anisotropic etching process, such that only the thickness (in the Z-direction) of the semiconductor layers 210B of the I/O device 202 are reduced while the length and width (in the X-Y plane) of the semiconductor layers 210B in the I/O device 202 remain substantially unchanged. In some embodiments, the trimming process may comprise an oxidation process followed by oxidation removal. And, the extent of trimming depends on the oxidation level. In some embodiments, while the core device 201 is covered by the hard mask 232, the I/O device 202 is exposed to a wet oxidation process, a dry oxidation process, or a combination thereof. Thereafter, the oxidized semiconductor layers 210B, which comprise silicon dioxide ($SiO_2$), are trimmed by an etchant such as $NH_4OH$ or diluted HF. In some embodiments, the extent of trimming of the semiconductor layers 210B of the I/O device 202 can be controlled by the extent of the oxidation. As depicted in FIG. 6B, in the I/O device 202, the trimmed semiconductor layers 210B' has a thickness T2 in the Z-direction, and the adjacent trimmed semiconductor layers 210B' are separated with space S2 in the Z-direction. The thickness T2 is less than the thickness T1 and the space S2 is larger than the space S1. In some embodiments, the sum of T1 and S1 is substantially equal to the sum of T2 and S2. In other words, a distance between the top surfaces of the adjacent trimmed semiconductor layers 210B' in the I/O area is substantially equal to a distance between the top surfaces of the adjacent semiconductor layers 210B in the core area. In some embodiments, about 5% to about 30% of the thickness T1 of the semiconductor layers 210B in the I/O device 202 is trimmed away to ensure sufficient thickness of the channel semiconductor layers as well as to increase the space between the channel semiconductor layers for later dipole process and/or WFM fill. In some further embodiments, more than 1 nm of the thickness is trimmed away. Therefore, the thickness T2 is less than the thickness T1 for more than 1 nm (T2≤T1−1 nm), and the space S2 is larger than the space S1 for more than 1 nm (S2≥S1+1 nm). In some embodiments, the thickness T2 of the trimmed semiconductor layers 210B' is about 2 nm to about 19 nm, and the space S2 between the trimmed semiconductor layers 210B' is about 6 nm to about 16 nm. As depicted in FIG. 6A, the thickness T1 of the semiconductor layers 210B and the space S1 between the semiconductor layers 210B in the core device 201 remain unchanged. After the trimming, the hard mask 232 and the photoresist layer 234 are removed by one or more etching processes.

Figure 7B:
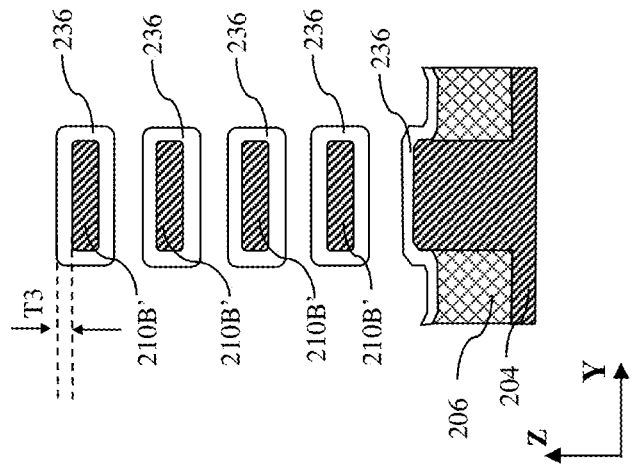
Figure 7A:
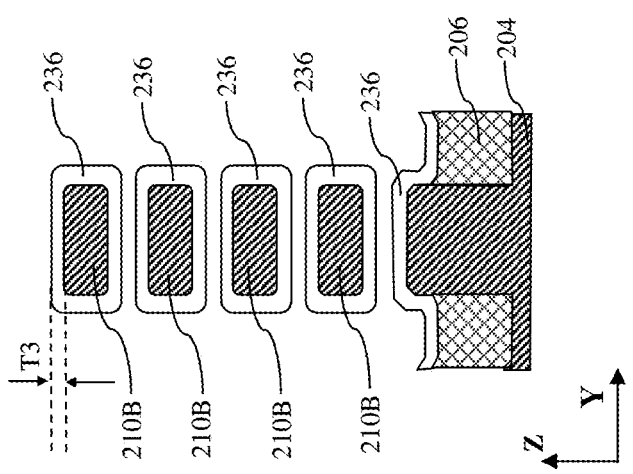

Now referring to FIGS. 1, 7A and 7B, at operation 120, interfacial layers 236 (also referred to as I/O oxide layers 236) are formed around the suspended semiconductor layers 210B in the core device 201 and the trimmed suspended semiconductor layers 210B' in the I/O device 202. The interfacial layers 236 may also be deposited over the substrate 204 and the isolation feature 206. In some embodiments, the interfacial layers 236 comprise materials such as $SiO_2$, SiON, HfSiO, other suitable materials, or combinations thereof. In some embodiments, a deposition process may be performed to form the first interfacial layers 236 wrapping around the suspended semiconductor layers 210B and the 210B'. The deposition process comprises CVD, PVD, ALD, other suitable methods, or combinations thereof. In some other embodiments, the interfacial layers 236 may be thermally grown (e.g. using an oxidation process) around the semiconductor layers 210B and 210B'. For example, in the case that the semiconductor layers 210B and 210B' comprise silicon, the core device 201 and the I/O device 202 may be exposed to a wet oxidation process, a dry oxidation process, or a combination thereof. Thereby, a thin layer including $SiO_2$ is formed around each of the semiconductor layers 210B and 210B' and works as the interfacial layer 236. In this case, the interfacial layer 236 is not grown on the surfaces of the isolation feature 206. In some embodiments, a thickness T3 (in the Z-direction) of each of the first interfacial layer 236 is about 1.2 nm to about 3.1 nm. The thickness T3 is designed to be thin enough to occupy less space (not increase the operation voltage) and thick enough to not easily break down (improve the reliability of the device). As depicted in FIGS. 7A and 7B, due to the different thicknesses of the semiconductor layers 210B in the core device 201 and the trimmed semiconductor layers 210B' in the I/O device 202, the space between the interfacial layers 236 are different in the core device 210 and in the I/O device 202. For example, the thickness T1 of the semiconductor layers 210B in the core device 201 is thicker than the thickness T2 of the trimmed semiconductor layers 210B' in the I/O device 202, the space between the interfacial layers 236 in the core device 201 is less than the space between the interfacial layers 236 in the I/O device 202.

Figure 8B:
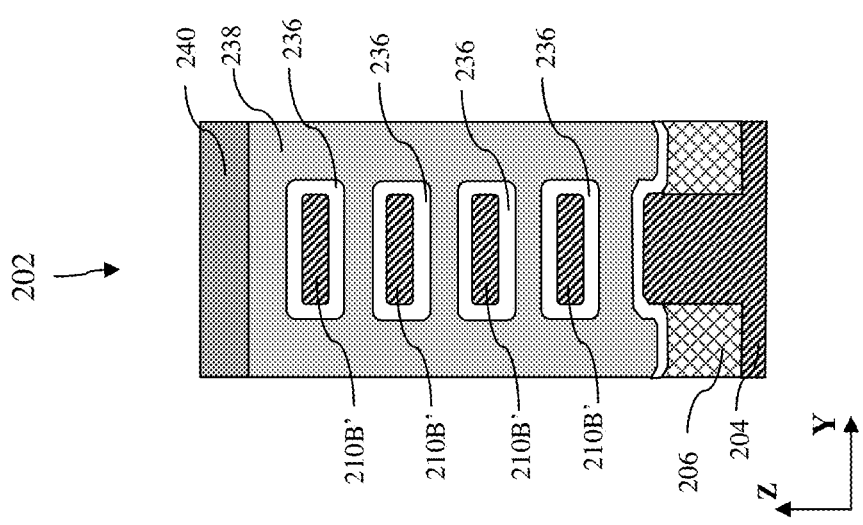
Figure 8A:
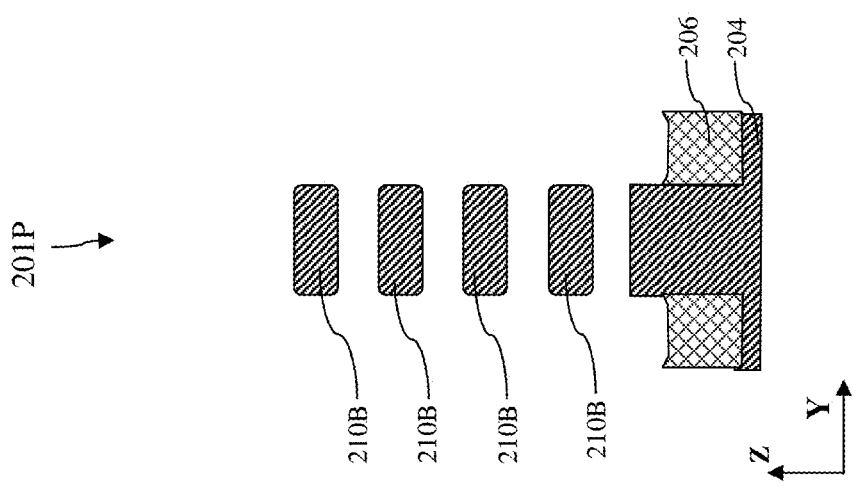
Figure 9B:
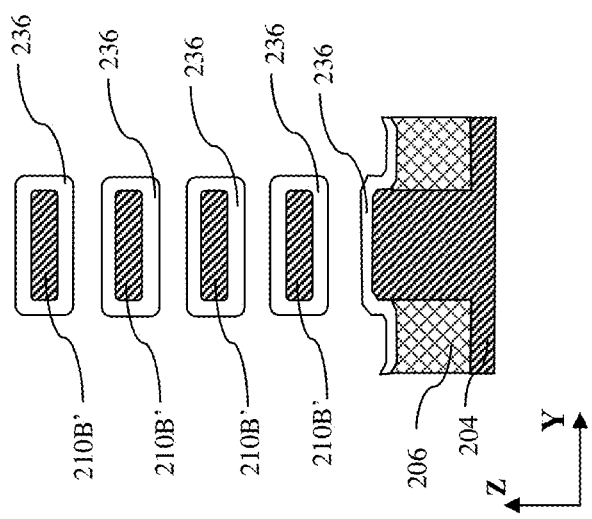
Figure 9A:
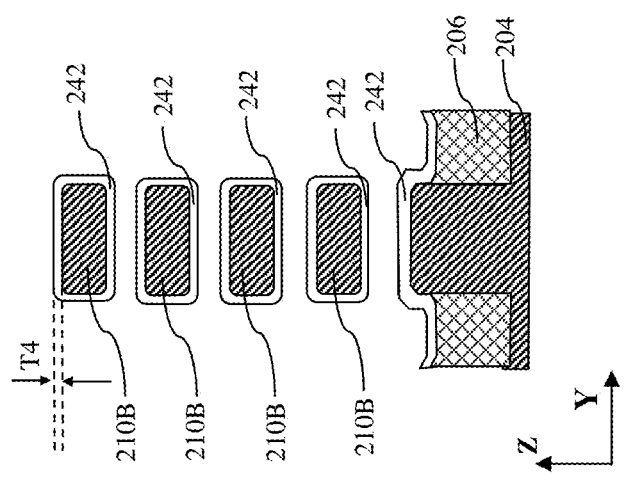

Now referring to FIGS. 1, 8A, 8B, 9A and 9B, at operation 125, the interfacial layers 236 in the core area are removed, and interfacial layers 242 are formed around the semiconductor layers 210B of the core device 201. Referring to FIGS. 8A and 8B, first, the I/O device 202 is covered by a hard mask 238 (for example, a BARC layer) and a photoresist layer 240 disposed over the hard mask 238. The formation processes of the hard mask 238 and the photoresist layer 240 are similar to those of the hard mask 232 and the photoresist layer 234. Thereafter, an etching process is performed to remove the interfacial layers 236 of the core device 201. The etching process may comprise a dry etch, a wet etch, other etching process, or combinations thereof. Subsequently, referring to FIGS. 9A and 9B, the interfacial layers 242 are formed around the semiconductor layers 210B of the core device 201. A material of the interfacial layers 242 is similar to that of the interfacial layer 236, for example, $SiO_2$, SiON, HfSiO, other suitable materials, or combinations thereof. In some embodiments, the interfacial layers 242 are formed by a deposition process (such as CVD, PVD, ALD, and/or other suitable deposition process) and are also formed over the substrate 204 and the isolation feature 206. In some other embodiments, the interfacial layers 242 are formed by an oxidation process to the core device 201, while the I/O device 202 is covered by the hard mask 238 and the photoresist layer 240. For example, in the case that the semiconductor layers 210B comprise silicon, the core device 201 of the IC 200 may be exposed to a wet oxidation process, a dry oxidation process, or a combination thereof. Thereby, a thin layer including $SiO_2$ is formed around each of the semiconductor layers 210B of the core device 201 and works as an interfacial layer 242. In this case, the interfacial layer 242 is not grown on the surfaces of the isolation feature 206. Thereafter, the hard mask 238 and the photoresist layer 240 are removed by one or more etching processes. As depicted in FIGS. 9A and 9B, a thickness T4 (in the Z-direction) of the interfacial layers 242 is less than the thickness T3 (FIG. 7B) of the interfacial layers 236. In some embodiments, the thickness T4 is about 0.6 nm to about 1.5 nm. Thus, the space between the suspended semiconductor layers 210B surrounded by the interfacial layers 236 in the core device 201 can be enlarged to ensure enough space for later formation of the gate dielectric layer and the gate electrode.

Now referring to FIGS. 1, 10A and 10B, at operation 130, gate dielectric layers 244 are formed around the interfacial layers 236 in the I/O device 202 and around the interfacial layers 242 in the core device 201. In some embodiments, the gate dielectric layers 244 comprise a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, hafnium dioxide-alumina ($HfO_2$-$Al_2O_3$) alloy, other suitable high-k dielectric material, or combinations thereof. High-k dielectric material generally refers to dielectric materials having a high dielectric constant, for example, greater than that of silicon oxide (k≈3.9). In some embodiments, the gate dielectric layers 244 are deposited by ALD and/or other suitable methods. In some embodiments, a thickness T5 (in the Z-direction) of the gate dielectric layers 244 is about 1.5 nm to about 1.8 nm. The thickness T5 cannot be too thin or too thick. If it is too thin, it might break easily. If it is too thick, it would occupy too much space and leave insufficient room for work function metal and bulk metal gate electrode.

In an IC fabricated without the extra trimming to the channel semiconductor layers in the I/O area, such as operation 115, the channel semiconductor layers are of the same thickness in the core area and the I/O area. Since the interfacial layers are of different thicknesses in different areas, i.e. thicker interfacial layer in the I/O area for handling higher gate voltage and thinner interfacial layer in the core area for handling lower gate voltage, there is less space between the channel semiconductor layers in the I/O device. Therefore, the high-k dielectric layers formed around the interfacial layers of the I/O device may be merged between the channel semiconductor layers. Thereby, the dipole patterning (will be discussed later) may be disabled due to the merged high-k dielectric layers in the tight space between the channel semiconductor layers of the I/O device. In addition, there is no space for the gate electrode (including the WFM and/or the bulk metal) to be formed between the channel semiconductor layers of the I/O device, since the space therebetween are filled up by the merged high-k dielectric layers. Therefore, the desired Vt of the I/O device cannot be achieved, and the performance of the IC is degraded.

However, in the present disclosure, as depicted in FIGS. 10A and 10B, due to the extra trimming to the channel semiconductor layers of the I/O device, the space between the trimmed semiconductor layers 210B' of the I/O device 202 are enlarged, thereby the merging issues of the high-k dielectric layers 244 between the semiconductor layers 210B' of the I/O device 202 is mitigated. Therefore, for the I/O device 202 of the present disclosure, it is possible to perform the dipole patterning between the semiconductor layers 210B', and there is enough space for the gate electrode (including the WFM and/or the bulk metal) to be formed between the semiconductor layers 210B' in the following steps. The dipole patterning to the high-k dielectric layer, or the WFM can help to achieve the desired Vt of the devices.

Figures 11A, 11B:
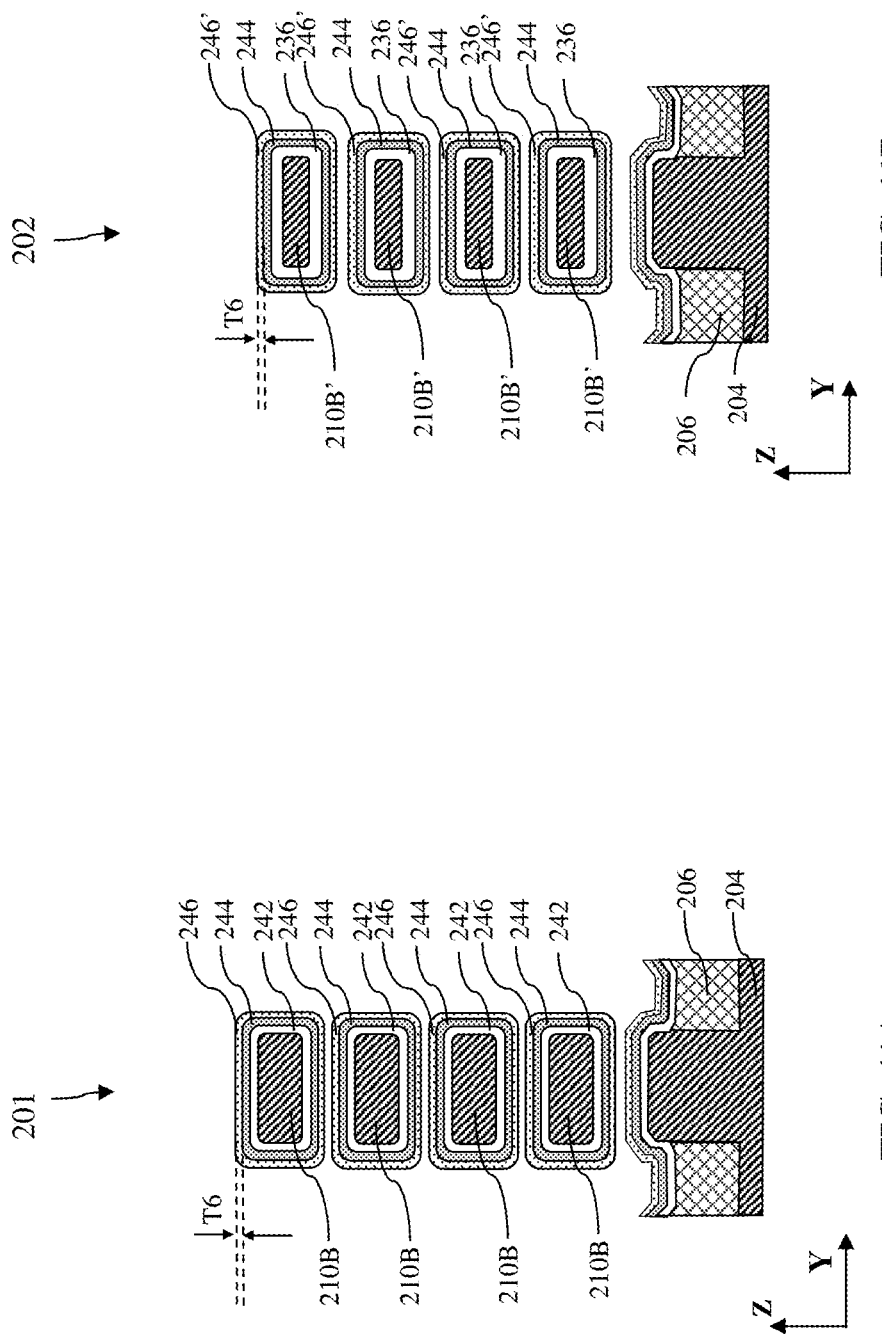

Now referring to FIGS. 1, 11A and 11B, at operation 135, dipole oxide layers 246 and 246' are deposited around the gate dielectric layers 244 of the core device 201 and the I/O device 202, respectively. In some embodiments, selection of the material of the dipole oxide layer 246 or 246' depends on the type of the transistors. For example, a dipole material suitable for n-type devices (also referred to as an n-type dipole material) may comprise lanthanoid oxide ($La_2O_3$), yttrium oxide ($Y_2O_3$), titanium oxide ($TiO_2$), other n-type dipole material, or combinations thereof; and a dipole material suitable for p-type devices (also referred to as a p-type dipole material) may comprise aluminum oxide ($Al_2O_3$), $TiO_2$, other p-type dipole material, or combinations thereof. In some embodiments, the dipole oxide layers for the core device 201 and for the I/O device 202 include same material. In some other embodiments, the dipole oxide layers for the core device 201 and for the I/O device 202 include different materials. In some embodiments, the dipole oxide layers 246 or 246' are conformally deposited around the high-k dielectric layers 244 by an ALD process. (i.e., the thickness T6 (in the Z-direction) of the dipole oxide layers 246 or 246' is about the same all around). The thickness T6 of the dipole oxide layers 246 or 246' is controlled by the ALD processing time. The thickness T6 cannot be too thick or too thin for a proper Vt adjustment according to the design requirement of the IC 200. In some embodiments, the thickness T6 of the dipole oxide layers 246 or 246' is about 0.3 nm to about 1 nm.

Now referring to FIGS. 1, 12A and 12B, at operation 140, dipole gate dielectric layers 250 are formed around each of the interfacial layers 242 of the core device 201 and dipole gate dielectric layers 250' are formed around each of the interfacial layers 236 of the I/O device 202. In some embodiments, a dipole oxide thermal drive-in process is performed such that the dipole gate dielectric layers 250 and 250' are formed. In some embodiments, the dipole oxide thermal drive-in process is an annealing process applied to the IC 200. The annealing temperate is about 600° C. to about 900° C. The high temperature makes the metal ions in the dipole oxide layers 246 and 246' penetrate into (react with) the gate dielectric layers 244, thus the gate dielectric layers 244 of the core device 201 and the I/O device 202 turn into dipole gate dielectric layers 250 and 250' (also referred to as gate dielectric layers with dipole), respectively. The metal ions increase the polarity of the gate dielectric layers, and thus can be used to adjust the Vt of the core device 201 or the I/O device 202. Any inactive dipole oxide is then removed by an etching process (including dry etching, wet etching, or combinations thereof) with an etchant such as acid (HCl), alkali ($NH_4$), oxidant, other suitable etchant, or combinations thereof.

As discussed above, when the space between the channel semiconductor layers of the I/O device is very tight, the dipole process could not be applied to the portion of the gate (high-k) dielectric layers merged between the channel semiconductor layers, thus using dipole high-k layer to adjust the Vt of the I/O devices is disabled. However, in the present disclosure, the space between the channel semiconductor layers in the I/O area is enlarged due to the extra trimming to the channel semiconductor layers. The entire high-k dielectric layers can be surrounded by the dipole oxide layer, and be dipole patterned. Thereby, the Vt of the I/O device in the present disclosure can be adjusted by the dipole gate dielectric layers.

Now referring to FIGS. 1, 13A and 13B, at operation 145, metal gate electrodes 252 are formed to fill the spaces between the semiconductor layers 210B of the core device 201 and the trimmed semiconductor layers 210B' of the I/O device 202. Each of the metal gate electrode 252 includes one or more work function metal (WFM) layers and bulk metal. The WFM layer is configured to tune a work function of its corresponding transistor to achieve a desired threshold voltage Vt. And, the bulk metal is configured to serve as the main conductive portion of the functional gate structure. In some embodiments, the metal gate electrodes 252 and 252' may include other layers, such as a capping layer, a barrier layer, etc. In some embodiments, the metal gate electrodes in the core device 201 and the I/O device 202 can share the same metal gate material. In some other embodiments, the metal gate electrodes in the core device 201 and the I/O device 202 include different metal gate materials. In some embodiments, the materials of the WFM layers may be different for different types of the devices. For example, for an n-type device, the material of the WFM layer may comprise titanium aluminum (TiAl), titanium aluminum carbide (TiAlC), tantalum aluminum carbide (TaAlC), titanium aluminum nitride (TiAlN), other materials, or combinations thereof; for a p-type device, the material of the WFM layer may comprise TiN, TSN, TaN, tungsten carbonitride (WCN), molybdenum (Mo), other suitable materials, or combinations thereof. Thus, the different Vt for the different types of the devices (for example, different n-type/p-type core device 201 and different n-type/p-type I/O device 202) can be achieved by different dipole materials and/or different WFM materials. In some embodiments, the bulk metal may contain Aluminum (Al), Tungsten (W), Copper (Cu), or combinations thereof. The various layers of the metal gate electrodes 252 may be formed by any suitable method, such as CVD, ALD, PVD, plating, chemical oxidation, thermal oxidation, other suitable methods, or combinations thereof. Thereafter, one or more polishing processes (for example, CMP) are applied to remove any excess conductive materials and planarize the top surface of the IC 200.

Referring to FIGS. 1, 14A and 14B, at operation 150, further processing is performed to complete the fabrication of the IC 200. For example, it may form various contacts/vias 270, metal lines (not shown), as well as other multilayer interconnect features, such as ILD layers 272 and etch stop layer (ESLs) 274 over the IC 200, configured to connect the various features to form a functional circuit that comprises the different semiconductor devices.

Although not intended to be limiting, one or more embodiments of the present disclosure provide many benefits to an integrated circuit and a formation process thereof. For example, embodiments of the present disclosure provide IC comprises trimmed channel semiconductor layers for the I/O device, such that the channel semiconductor layers of the I/O device is thinner than the channel semiconductor layers of the core device, therefore the space between the trimmed channel semiconductor layers of the I/O device is larger than the space between the channel semiconductor layers of the core device. Thereby, even though the interfacial layer of the I/O device is thicker than that of the core device, the merging issues of the dielectric layers of the conventional I/O device can be mitigated. In addition, dipole gate dielectric layers are formed for both the I/O device and the core device, thereby the Vt for different types (n-type or p-type, I/O device or core device) of devices can be achieved by different dipole gate dielectric layers and/or different WFM layers.

The present disclosure provides for many different embodiments. Semiconductor device having trimmed channel and dipole gate dielectric layer and methods of fabrication thereof are disclosed herein. An exemplary semiconductor device comprises first semiconductor layers over a first area of a substrate, wherein the first semiconductor layers are separated from each other and are stacked up along a direction substantially perpendicular to a top surface of the substrate; second semiconductor layers over a second area of the substrate, wherein the second semiconductor layers are separated from each other and are stacked up along the direction substantially perpendicular to the top surface of the substrate, and a thickness of each of the second semiconductor layers is less than a thickness of each of the first semiconductor layers; a first interfacial layer around each of the first semiconductor layers; a second interfacial layer around each of the second semiconductor layer; a first dipole gate dielectric layer around each of the first semiconductor layers and over the first interfacial layer; a second dipole gate dielectric layer around each of the second semiconductor layers and over the second interfacial layer; a first gate electrode around each of the first semiconductor layers and over the first dipole gate dielectric layer; and a second gate electrode around each of the second semiconductor layers and over the second dipole gate dielectric layer.

In some further embodiments, the first area is a core area and the second area is an I/O area. In some embodiments, the thickness of each of the second semiconductor layers is less than the thickness of each of the first semiconductor layers for more than about 1 nm.

In some embodiments, a thickness of the first interfacial layer is less than a thickness of the second interfacial layer. In some further embodiments, the thickness of the first interfacial layer is less than the thickness of the second interfacial layer for more than about 1.5 nm. In some further embodiments, a thickness of the second interfacial layer is about 1.2 nm to about 3.1 nm.

In some further embodiments, a distance between top surfaces of adjacent first semiconductor layers is substantially equal to a distance between top surfaces of adjacent second semiconductor layers. In some further embodiments, a distance between closest surfaces of adjacent second semiconductor layers is greater than a distance between closest surfaces of adjacent first semiconductor layers for more than about 1 nm.

An exemplary method of forming the semiconductor devices comprises forming a stack of first semiconductor layers in a first area over a substrate and a stack of second semiconductor layers in a second area over the substrate, wherein the first semiconductor layers are separated from each other and are stacked up along a direction substantially perpendicular to a top surface of the substrate and the second semiconductor layers are separated from each other and are stacked up along the direction substantially perpendicular to the top surface of the substrate; trimming the second semiconductor layers such that a thickness of each of the second semiconductor layers is less than a thickness of each of the first semiconductor layers; forming a first interfacial layer around each of the first semiconductor layers and a second interfacial layer around each of the second semiconductor layers; forming a first dipole gate dielectric layer around the first interfacial layer and a second dipole gate dielectric layer around the second interfacial layer; and depositing a first gate electrode around the first dipole gate dielectric layer and a second gate electrode around the second dipole gate dielectric layer.

In some embodiments, the forming the first dipole gate dielectric layer around the first interfacial layer and the second dipole gate dielectric layer around the second interfacial layer includes depositing a first gate dielectric layer around the first interfacial layer and a second gate dielectric layer around the second interfacial layer; depositing a first dipole oxide layer around the first gate dielectric layer and a second dipole oxide layer around the second gate dielectric layer; and performing an annealing process to the semiconductor device to form the first dipole gate dielectric layer around the first interfacial layer and a second dipole gate dielectric layer around the second interfacial layer. In some embodiments, the first dipole oxide layer and the second dipole oxide layer include a material selected from lanthanoid oxide ($La_2O_3$), yttrium oxide ($Y_2O_3$), titanium oxide ($TiO_2$), and aluminum oxide ($Al_2O_3$). In some embodiments, a thickness of the first dipole oxide layer and the second dipole oxide layer is about 0.3 nm to about 1 nm.

In some embodiments, the trimming the second semiconductor layers includes reducing a thickness of each of the second semiconductor layers by about 5% to about 30%.

In some embodiments, the trimming the second semiconductor layers includes forming a hard mask over the first semiconductor layers in the first area; trimming the second semiconductor layers in the second area; and removing the hard mask over the first semiconductor layers in the first area. In some embodiments, trimming the second semiconductor layers in the second area includes performing an oxidation process to the second semiconductor layers in the second area to form oxidized surfaces of the second semiconductor layers; and etching the oxidized surfaces of the second semiconductor layers.

Another exemplary method comprises forming semiconductor layers in a core area of a substrate, wherein the semiconductor layers in the core area are separated from each other and are stacked up along a direction generally perpendicular to a top surface of the substrate; forming semiconductor layers in an I/O area of the substrate, wherein the semiconductor layers in the I/O area are separated from each other and are stacked up along the direction generally perpendicular to the top surface of the substrate, and a thickness of each of the semiconductor layers in the I/O area is less than a thickness of each of the semiconductor layers in the core area; depositing a first interfacial layer around each of the semiconductor layers in the I/O area; forming a second interfacial layer around each of the semiconductor layers in the core area, wherein a thickness of the second interfacial layer is less than a thickness of the first interfacial layer; and forming a first metal gate structure around the first interfacial layer in the I/O area and a second metal gate structure around the second interfacial layer in the core area, wherein each of the first metal gate structure and the second metal gate structure includes a dipole gate dielectric layer and a gate electrode.

In some embodiments, the forming the second interfacial layer around each of the semiconductor layers in the core area includes depositing the first interfacial layer around the semiconductor layers in the core area; forming a hard mask over the I/O area; removing the first interfacial layer around the semiconductor layers in the core area; forming the second interfacial layer around the semiconductor layers in the core area; and removing the hard mask over the I/O area. In some embodiments, the forming the second interfacial layer includes performing an oxidation process in the core area to form the second interfacial layer.

In some embodiments, a thickness of the second interfacial layer is less than a thickness of the first interfacial layer for about 1.5 nm. In some embodiments, a distance between top surfaces of adjacent semiconductor layers in the core area is substantially same as a distance between top surfaces of adjacent semiconductor layers in the I/O area The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming a stack of first semiconductor layers in a first area over a substrate and a stack of second semiconductor layers in a second area over the substrate, wherein the first semiconductor layers are separated from each other and are stacked up along a direction substantially perpendicular to a top surface of the substrate and the second semiconductor layers are separated from each other and are stacked up along the direction substantially perpendicular to the top surface of the substrate;

trimming the second semiconductor layers such that a thickness of each of the second semiconductor layers is less than a thickness of each of the first semiconductor layers, wherein the trimming of the second semiconductor layers includes:

performing an oxidation process to the second semiconductor layers in the second area to form oxidized surfaces of the second semiconductor layers; and removing the oxidized surfaces of the second semiconductor layers;

forming a first interfacial layer around each of the first semiconductor layers and a second interfacial layer around each of the second semiconductor layers;

forming a first dipole gate dielectric layer around the first interfacial layer and a second dipole gate dielectric layer around the second interfacial layer; and depositing a first gate electrode around the first dipole gate dielectric layer and a second gate electrode around the second dipole gate dielectric layer.

2. The method of claim 1, wherein the forming the first dipole gate dielectric layer around the first interfacial layer and the second dipole gate dielectric layer around the second interfacial layer includes:

depositing a first gate dielectric layer around the first interfacial layer and a second gate dielectric layer around the second interfacial layer;

depositing a first dipole oxide layer around the first gate dielectric layer and a second dipole oxide layer around the second gate dielectric layer; and performing an annealing process to the semiconductor device to form the first dipole gate dielectric layer around the first interfacial layer and a second dipole gate dielectric layer around the second interfacial layer.

3. The method of claim 2, wherein the first dipole oxide layer and the second dipole oxide layer include a material selected from lanthanoid oxide (La2O3), yttrium oxide (Y2O3), titanium oxide (TiO2), and aluminum oxide (Al2O3).

4. The method of claim 2, wherein a thickness of the first dipole oxide layer and the second dipole oxide layer is about 0.3 nm to about 1 nm.

5. The method of claim 1, wherein the trimming the second semiconductor layers includes reducing a thickness of each of the second semiconductor layers by about 5% to about 30%.

6. The method of claim 1, wherein the trimming of the second semiconductor layers further includes:

forming a hard mask over the first semiconductor layers in the first area;

trimming the second semiconductor layers in the second area while the hard mask is disposed over the first semiconductor layers in the first area; and removing the hard mask over the first semiconductor layers in the first area.

7. The method of claim 1, wherein the removing the oxidized surfaces of the second semiconductor layers includes etching the oxidized surfaces of the second semiconductor layers.

8. A method of forming a semiconductor device, comprising:

forming semiconductor layers in a core area of a substrate, wherein the semiconductor layers in the core area are separated from each other and are stacked up along a direction generally perpendicular to a top surface of the substrate;

forming semiconductor layers in an I/O area of the substrate, wherein the semiconductor layers in the I/O area are separated from each other and are stacked up along the direction generally perpendicular to the top surface of the substrate, and a thickness of each of the semiconductor layers in the I/O area is less than a thickness of each of the semiconductor layers in the core area;

forming a first interfacial layer around each of the semiconductor layers in the I/O area and around each of the semiconductor layer in the core area;

removing the first interfacial layer around each of the semiconductor layers in the core area;

forming a second interfacial layer around each of the semiconductor layers in the core area, wherein a thickness of the second interfacial layer is less than a thickness of the first interfacial layer; and forming a first metal gate structure around the first interfacial layer in the I/O area and a second metal gate structure around the second interfacial layer in the core area, wherein each of the first metal gate structure and the second metal gate structure includes a dipole gate dielectric layer and a gate electrode.

9. The method of claim 8, further comprising:

forming a hard mask over the I/O area prior to removing the first interfacial layer around each of the semiconductor layers in the core area;

removing the hard mask over the I/O area after the forming a second interfacial layer around each of the semiconductor layers in the core area.

10. The method of claim 9, wherein the forming the second interfacial layer includes:

performing an oxidation process in the core area to form the second interfacial layer.

11. The method of claim 8, wherein a thickness of the second interfacial layer is less than a thickness of the first interfacial layer for about 1.5 nm.

12. The method of claim 11, wherein a distance between top surfaces of adjacent semiconductor layers in the core area is substantially same as a distance between top surfaces of adjacent semiconductor layers in the I/O area.

13. A method comprising:

forming a stack of first semiconductor layers in a first area over a substrate and a stack of second semiconductor layers in a second area over the substrate, wherein the first semiconductor layers are separated from each other and the second semiconductor layers are separated from each other;

removing portions from the second semiconductor layers to form modified second semiconductor layers, wherein a thickness of each of the modified second semiconductor layers is different than a thickness of each of the first semiconductor layers;

forming a first interfacial layer around each of the first semiconductor layers and each of the modified second semiconductor layers;

removing the first interfacial layer from around each of the modified second semiconductor layers;

forming a second interfacial layer around each of the modified second semiconductor layers;

forming a first dipole gate dielectric layer around the first interfacial layer and a second dipole gate dielectric layer around the second interfacial layer; and forming a first gate electrode around the first dipole gate dielectric layer and a second gate electrode around the second dipole gate dielectric layer.

14. The method of claim 13, wherein the forming of the first dipole gate dielectric layer around the first interfacial layer includes:
- forming a high-k dielectric layer around the first interfacial layer;
- forming a dipole oxide layer around the high-k dielectric layer; and
- performing an annealing process on the dipole oxide layer and the high-k dielectric layer to form the first dipole gate dielectric layer.

15. The method of claim 14, wherein the dipole oxide layer includes a material selected from the group consisting of lanthanoid oxide (La2O3), yttrium oxide (Y2O3), titanium oxide (TiO2), and aluminum oxide (Al2O3).

16. The method of claim 13, wherein the thickness of each of the modified second semiconductor layers is less than the thickness of each of the first semiconductor layers.

17. The method of claim 13, wherein the removing of the portions from the second semiconductor layers to form modified second semiconductor layers includes performing an anisotropic etching process.

18. The method of claim 13, wherein the removing of the portions from the second semiconductor layers to form modified second semiconductor layers includes performing an oxidation process.

19. The method of claim 13, wherein each of the second semiconductor layers has a length in a direction substantially perpendicular to the thickness of each of the second semiconductor layers,
- wherein each of the modified second semiconductor layers has a length in the direction substantially perpendicular to the thickness of each of the modified second semiconductor layers, and
- wherein the length of each of the second semiconductor layers is substantially similar to the length of each of the modified second semiconductor layers.

20. The method of claim 13, wherein a thickness of the second interfacial layer around each of the modified second semiconductor layers is less than a thickness of the first interfacial layer around each of the first semiconductor layers after the forming of the second interfacial layer around each of the modified second semiconductor layers.

* * * * *